United States Patent [19]

Fielden et al.

[11] Patent Number: 5,563,506
[45] Date of Patent: Oct. 8, 1996

[54] ELECTRICITY METERS USING CURRENT TRANSFORMERS

[75] Inventors: John S. Fielden, Devon; Andrew L. James, Winchester; Barnaby J. McCabe, Redland, all of England

[73] Assignee: Polymeters Response International Limited, Hampshire, England

[21] Appl. No.: 426,402

[22] Filed: Mar. 24, 1995

Related U.S. Application Data

[63] Continuation-in-part of Ser. No. 131,437, Oct. 4, 1993, abandoned, which is a continuation of Ser. No. 727,886, Jul. 10, 1991, abandoned.

[30] Foreign Application Priority Data

Jul. 10, 1990 [GB] United Kingdom ............... 9015199

[51] Int. Cl.$^6$ ................................................. G01R 21/06
[52] U.S. Cl. ..................... 324/142; 364/483; 364/571.07
[58] Field of Search ........................... 324/126, 127, 324/142, 132, 140 R, 141, 76 R, 74; 364/481, 483, 571.07, 571.01; 336/82, 111; 327/356

[56] References Cited

U.S. PATENT DOCUMENTS

| | | | |
|---|---|---|---|
| 4,454,471 | 6/1984 | Schwendtner et al. | 324/141 |
| 4,463,311 | 7/1984 | Kobayashi | 324/142 |
| 4,491,790 | 1/1985 | Miller | 324/142 |
| 4,837,504 | 6/1989 | Baer et al. | 324/142 |
| 4,839,819 | 6/1989 | Begin et al. | 324/142 |
| 4,884,021 | 11/1989 | Hammond et al. | 324/142 |
| 4,887,028 | 12/1989 | Voisine et al. | 324/142 |
| 4,887,029 | 12/1989 | Hemminger | 324/142 |
| 5,017,860 | 5/1991 | Germer et al. | 324/141 |
| 5,132,610 | 7/1992 | Ying-Chang | 324/142 |

FOREIGN PATENT DOCUMENTS

| | | |
|---|---|---|
| 2040051 | 8/1980 | United Kingdom. |
| 2041588 | 9/1980 | United Kingdom. |
| 2083306 | 3/1982 | United Kingdom. |

*Primary Examiner*—Vinh P. Nguyen
*Attorney, Agent, or Firm*—Wood, Phillips, VanSanten, Clark & Mortimer

[57] ABSTRACT

Electronic electricity meter, in which the electrical energy consumed by a load is evaluated using a signal indicative of voltage supplied to the load and a signal indicative of load current. The load current signal is derived from an estimated load current value produced by a current transformer (4). The meter includes a memory (9) storing one or more constants from equations indicative of how current transformer phase and ratio errors vary as primary current varies. An adjusted value for the load current is produced by calculating the phase and/or ratio error using the stored constants and the estimated load current value and correcting the estimated load current value to eliminate the error. Alternatively, the meter includes a memory (9) storing a plurality of values of phase error and/or ratio error for a respective plurality of primary current values of the current transformer of predetermined configuration. The estimated load current value is used to select from the storing means (9) a value of phase error and/or ratio error for one of said plurality of primary current values corresponding to the estimated value of primary current. The load current value is corrected using the selected value of phase and/or ratio error.

13 Claims, 5 Drawing Sheets

ELECTRICITY METERS USING CURRENT TRANSFORMERS

This application is a continuation-in-part of application Ser. No. 08/131,437, filed Oct. 4, 1993, now abandoned which is a continuation of Ser. No. 07/727,886, filed Jul. 10, 1991, now abandoned.

The present invention relates to electricity meters of the type termed static, solid state, or electronic, and more particularly to such meters using current transformers.

Electronic metering of electrical energy requires the independent sensing of both load current and supply voltage, continuous multiplication of these two quantities to produce instantaneous load power and the integration of varying load power with respect to time to derive accumulated energy usage. In general the sensing of supply voltage is simply effected through a potentiometric resistive divider. The sensing of load current is more problematic and can be effected by a variety of well known means.

The load current can most simply be sensed by use of a resistive "shunt" in the load current path. This does suffer from instability with respect of temperature and is particularly inconvenient when it is required to reference a number of independent circuits to a common point as may be required in designs of polyphase metering equipment. Nevertheless, especially for single phase metering, a shunt circuit with temperature compensation such as that disclosed, for example, in French Patent 2663013 can be an effective means of current sensing.

The current transformer is a particularly effective means of sensing load current. Typically the whole load current passes through the center of the transformer core, thereby forming one turn, and the detected secondary current is precisely equal to the load current divided by the number of turns in the secondary winding. The secondary current is effectively driven from a constant current generator, and generates a voltage in a load resistor which is then used as a precise measure of load current so forming one of the inputs to the multiplier circuit, the other being supply voltage as already discussed.

Designs of static meter employing internal current transformers are well established and have been described, for example in GB 2041588, GB 2040051, GB 2083306.

In polyphase supply situations where high load currents are being drawn, typically from 300 to 1000 Amp, it is common practice to utilize exterior current transformers of known precise ratio, connecting secondary currents of typically 1 Amp or 5 Amp maximum value to the meter. These isolated currents can be directly referenced to a common point or be sensed through further current transformers internal to the body of the meter as described in preceding paragraphs.

In situations where a medium level of current is to be supplied of the order of 80 Amp to 200 Amp maximum, the conductors are of such manageable size that they can be directly wired without difficulty to a terminal block on the meter. Such arrangements are common for domestic and smaller commercial consumers where electricity is metered without recourse to the use of external measuring current transformers. The term whole-current metering sensibly applies to this simple form of electrical connection, whether on single or polyphase supply.

A problem that arises when using current transformers in, or conjunction with, electricity meters is that magnetization effects (etc.) cause errors in the current transformer measurements of current. These current transformer errors lead to a lowering of the accuracy of the readings given by the associated electricity meter.

Conventionally this problem is avoided by design of the current transformer in such a way as to minimize the current measurement errors, this can be done for example by using a transformer core made of mu-metal rather than the more common grain oriented silicon steel (GOSS) core materials, or by using a large number of turns for core material of relatively low magnetization current and level of core magnetization. However, these solutions are not entirely satisfactory since, for example, it is more expensive to use a mu-metal core than a GOSS core and current transformers having the required number of turns (possibly several thousand) are more costly to make.

The present invention provides a way of reducing the effects of current transformer errors by compensating for those errors either in the electricity meter or in an extra module provided between the current transformer and the meter.

By adopting measures according to the present invention an electricity meter may be obtained having an acceptable level of accuracy while using a current transformer having a GOSS core. The same principles can be employed to reliably correct even large errors as may be experienced with cores constructed of ferrite material.

The errors in current transformer measurement of currents may be separated into 2 parts;

a) phase errors: the phase of the current in the secondary of the current transformer is shifted with respect to that in the primary; and b) ratio errors: the effective dividing ratio of the current transformer is not constant over a range of primary currents.

It has been found that the phase error (P) varies with the magnitude ($I_1$) of the primary current approximately according to the relationship:

$$P = K_1 + K_2 \cdot I_1^{-m} \quad (1)$$

where M, $K_1$ and $K_2$ are constants

In practice it has been found that the variation of phase error (P) with primary current ($I_1$) often follows equation (1) with M approximately equal to ½. Consequently a square root approximation can often conveniently be employed as part of the overall correction algorithm. FIG. 5 shows an example of the variation in phase error (P) found for a particular GOSS core, it may be seen that the variation closely fits equation (1) with M=½ within the limits of experimental error. The compensation techniques of the present invention are equally applicable, however, for cores where the value of the power, M, is other than ½.

It has also been found that the ratio error ($r_e$) varies with the magnitude ($I_1$) of the primary current as follows:

$$r_e(\%) = K_3 + K_4 \log I_1 \quad (2)$$

where $K_3$ and $K_4$ are constants.

The effect of the ratio error is to alter the relationship between the magnitude of measured secondary current ($I_2$) and primary current ($I_1$) from the theoretical relationship ($I_1 = I_2 n$), where n=turns ratio, to the actual relationship:

$$I_1 = I_2' \left( n + \frac{n r_e}{100} \right) \quad (3)$$

Thus $I_2'$, measured magnitude of secondary current, is related to $I_2$ theoretical magnitude of secondary current, as follows:

$$I_2 = I_2' (1 + r_e/100)$$

The values of the constants $K_1$, $K_2$, $K_3$ and $K_4$ vary dependent upon the configuration of the current transformer, e.g. upon factors such as core material and turns ratio, and may be ascertained by experiment for any given core configuration.

FIG. 1 illustrates the variation of phase error and ratio error with the logarithm of primary current magnitude, at low current values, observed for a current transformer rated at 100 A having a burden of 40 ohms and having a GOSS (grain orientated silicon steel) core, in a first configuration (shown in solid lines) having a primary winding having 4 turns and a secondary winding having 1000 turns, and in a second configuration (dashed lines) having 16 and 4000 turns respectively. The values of constants $K_1$, $K_2$, $K_3$ and $K_4$ of equations (1) and (2) above may be derived from graphs such as these.

FIG. 2 shows an experimental set-up which may be used to obtain the data for graphs such as those of FIG. 1.

By evaluating and storing the values of $K_1$, $K_2$, $K_3$, and $K_4$ for a given current transformer configuration it becomes possible substantially to compensate for phase error and/or ratio error arising when that CT configuration is used to measure a current. Thus a CT unit can be made incorporating correction circuitry.

In metering situations, the phase errors and/or ratio errors arising in a current transformer which is internal to an electronic electricity meter may be compensated, for example in the data processing section of the meter. If that meter is to be used in conjunction with an external CT of known type then, for enhanced accuracy, the correction apparatus may be adapted to correct for phase and/or ratio errors both in the internal CT and in the external CT.

Further features and advantages of the present invention will become clear from the following description of an embodiment thereof, given by way of example, and illustrated by the accompanying drawings, in which:

FIG. 4 shows phasor diagrams illustrating how phase and ratio errors may be compensated in the meter of FIG. 3, in which:

The following description relates to an embodiment of the invention wherein phase errors and ratio errors arising in a current metering current transformer which is internal to an electronic electricity meter are substantially compensated within the meter itself. It is to be understood that similar techniques may be applied additionally or alternatively within an electronic electrify meter to compensate for one or both types of such errors arising when an external current transformer is used with such a meter or with a meter lacking an internal current transformer.

Modern electronic electrify meters incorporating a current transformer also often include a microprocessor, or the like, for calculating energy consumption based on the metered values of load current and supply voltage. The following discussion of compensation for phase and ratio errors assumes that the meter under discussion includes a microprocessor. The elements of such a meter are illustrated in FIG. 3.

The discussion below deals with compensation for phase and ratio error sin respect of a current associated with a single phase of metered supply voltage, the extension of the technique to multiphase supplies is straight-forward. When applying the present invention to the metering of multiphase supplies each measured secondary current should be adjusted independently of the other phases (i.e., separate calculations of phase and ratio error should be made for each phase's measured secondary current). However, in general it will be permissible to apply equations 1 and 2 in the same form for all of the calculations for that supply (i.e., it will usually be appropriate to assume that the current transformers used for the different phases follow the same error equations). It is also assumed that the microprocessor in this embodiment uses a vector representation of the metered quantities in calculation of true power, power factor etc.

Furthermore, in the following embodiment energy consumption is metered by sensing the fundamental frequency component of current, I', at phase$\phi'$ relative to voltage, and correcting I'cos$\phi'$ to Icos$\phi$. It has been found that where it is desired to meter total harmonic energy in such an embodiment then a good accuracy is obtained by treating the ratio of true total harmonic energy to measured total harmonic energy as being equal to the ratio of Icos$\phi$ to I'cos$\phi'$. That is, total harmonic energy may be found by scaling the measured/calculated value of total harmonic energy based on the level of correction applied to the fundamental current component.

Figure 1:
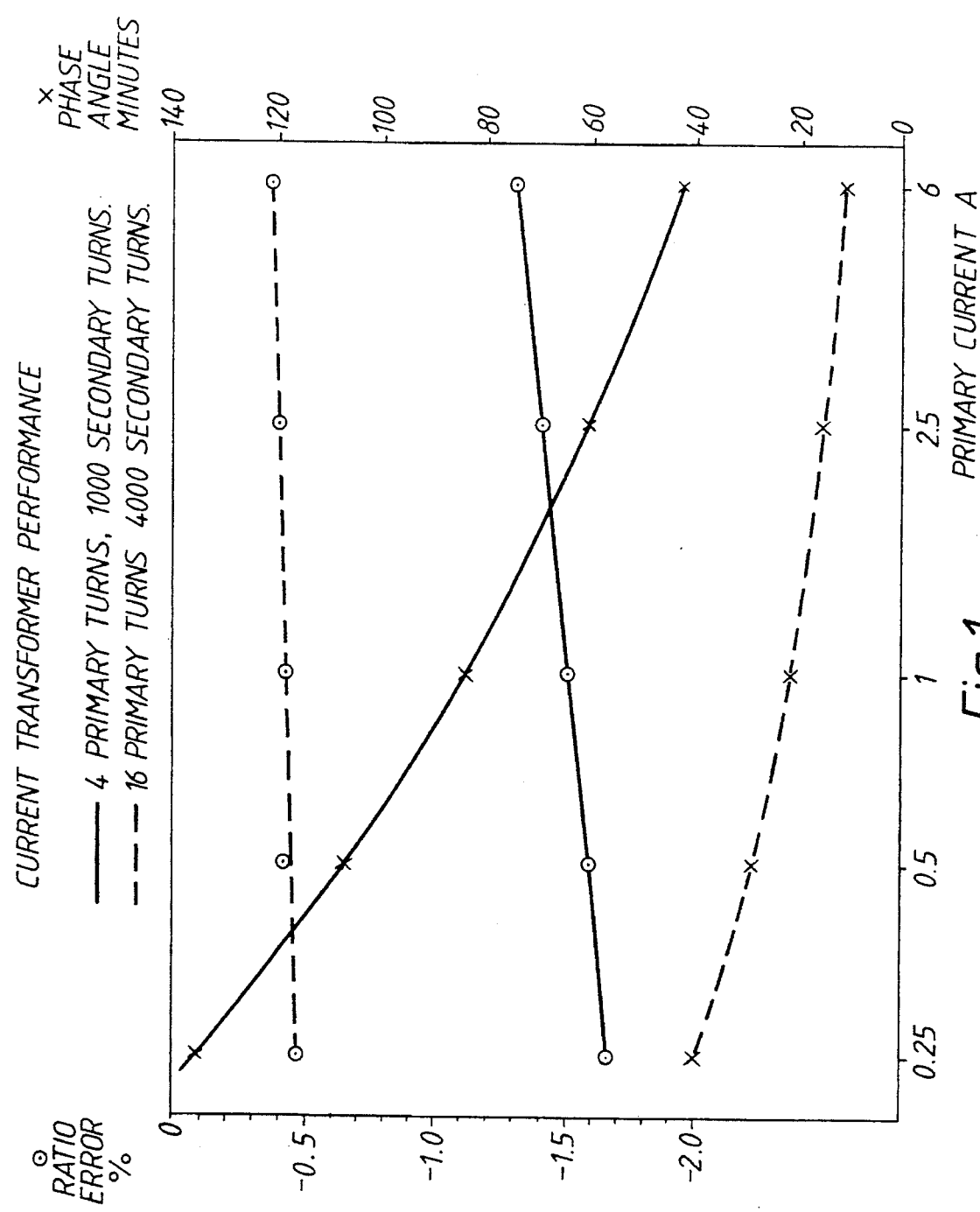
FIG. 1 is a graph of the phase difference (in minutes of arc) between the primary current and secondary current, and of the ratio error (as a percentage), in a first and second configuration of current transformer, plotted against the magnitude of the primary current (in Amperes) on a logarithmic scale.
Figure 2:
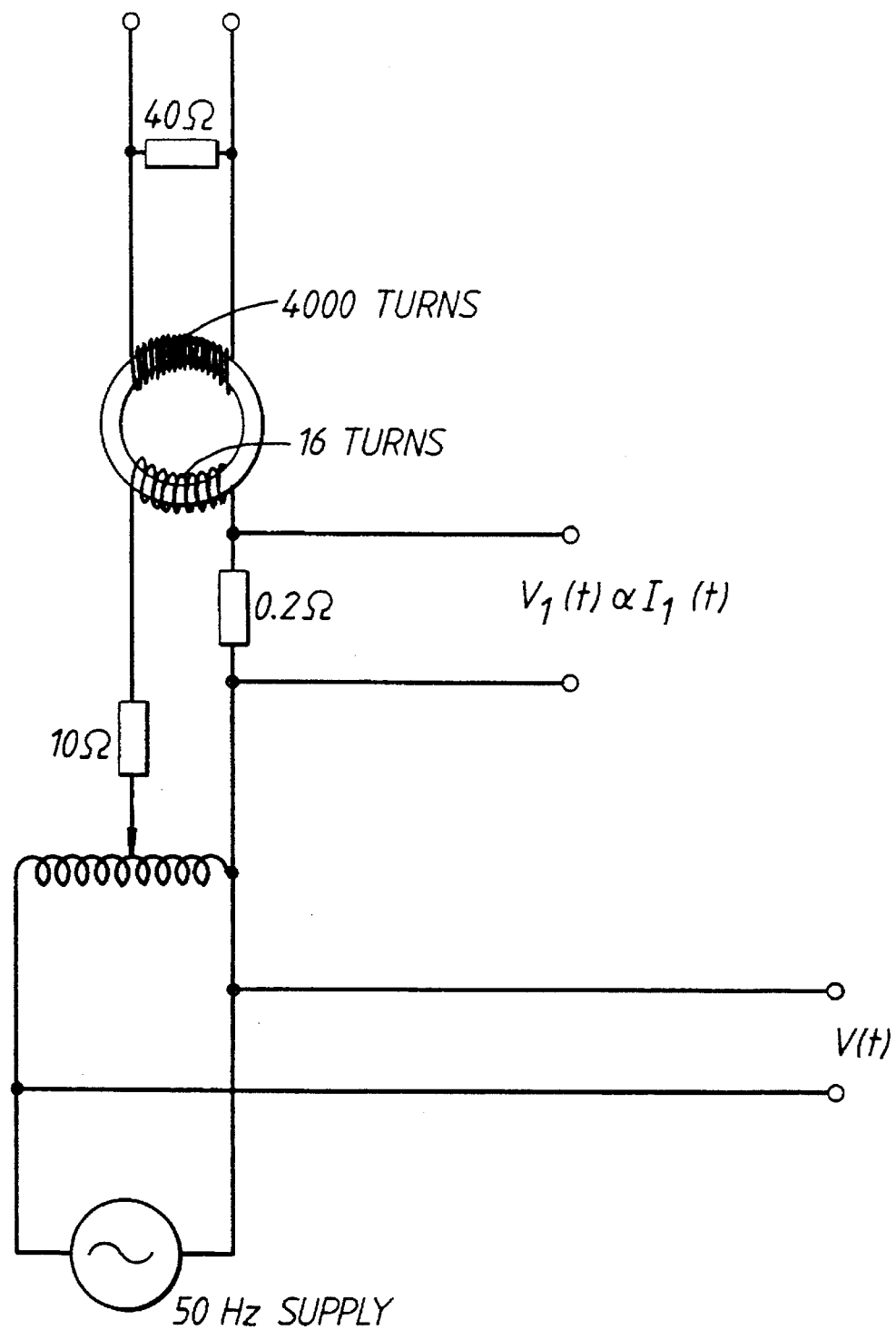
FIG. 2 illustrates diagrammatically an experimental set-up which may be used for obtaining data for graphs according to FIG. 1.
Figure 3:
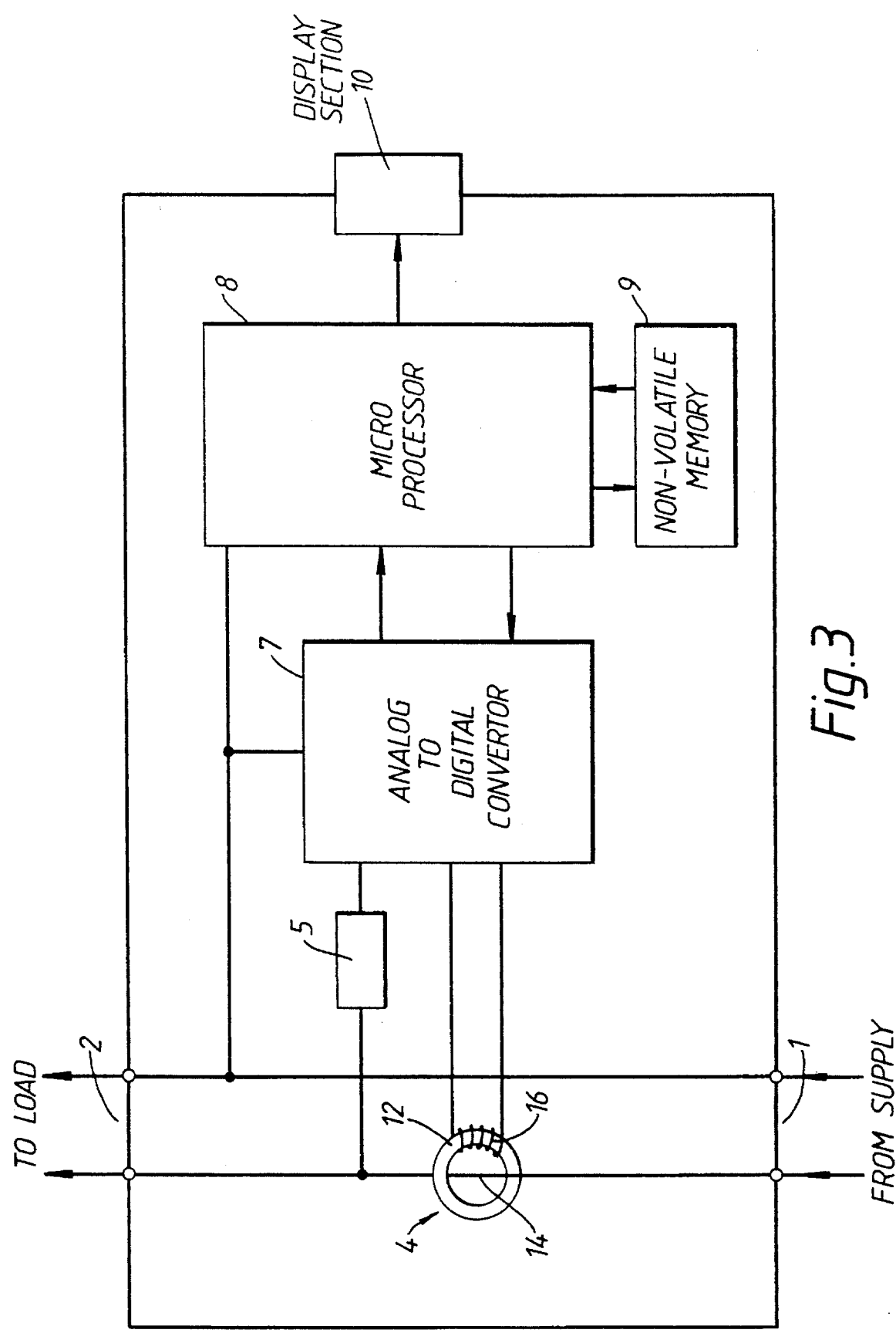
FIG. 3 is a block diagram showing schematically the elements of an electronic electricity meter according to one embodiment of the invention.

As shown in FIG. 3 the meter of this embodiment is adapted for connection between the supply and a load (or loads) via input terminals 1 and output terminals 2. A current transformer 4 internal to the meter is used to sense the load current to be measured. The supply voltage to be measured is sensed through a resistor 5. The outputs from the current transformer 4 and resistor 5 are fed to a microprocessor 8 through an analog-to-digital converter 7. The microprocessor 8 is connected to a non-volatile memory 9 which is adapted to store values of the constant $K_1$, $K_2$, $K_3$, $K_4$ and M of equations 1 and 2 above appropriate to the configuration of current transformer used in the meter (e.g. for the core materials, number of turns in the secondary winding etc.).

The microprocessor is configured to implement equations (1) and (2) in an appropriate form (i.e. to apply equation (1) using the stored value of the power, M) and using the stored values of the constants $K_1$–$K_4$.

The microprocessor 8 is also connected to a display section 10 on which the metered quantities maybe displayed. Manual selection means may also be provided to enable a user to select between a number of different metered quantities for display. Additional circuitry may be provided, for example a communications section to enable remote reporting of the metered quantities to take place.

The operation of the meter of FIG. 3 will now be described. Under the control of the microprocessor 8 samples of load current and supply voltage are taken at known times in relation to the fundamental frequency component of either the load current or supply voltage. Before calculating quantities to be output such as real power, total power, reactive power etc. the microprocessor 8 adjusts the measured value of current in order to compensate for the effect of phase errors and ratio errors in the current transformer. The current transformer 4 comprises a core 12. A primary winding comprises a conductor 14 passing from the supply terminal 1 to the load terminal 2. The number of turns of the primary winding 14 is represented by $N_1$. A secondary winding 16 is wound about the core 15 connected to the converter 7. The number of turns of the secondary winding is represented by $N_2$. Thus, the transformer 4 has a ratio $N_2/N_1$. In order to do this the microprocessor performs a calculation using the initial uncorrected measure of current together with reference to the constants held in the non-volatile memory 9 using equations (1) and (2). An initial measure, or "assumed value", of primary current is produced using the theoretical relationship between primary and secondary current, as follows:

Estimated value of $I_1$=n×measured value of $I_2$ where n is the turns ratio. This "assumed value" of primary current is then used by the microprocessor to implement equations (1) and (2). The initial measure of primary current is then altered to compensate for phase and/or ratio errors as described below with reference to FIGS. 4a and 4b.

Figure 4A:
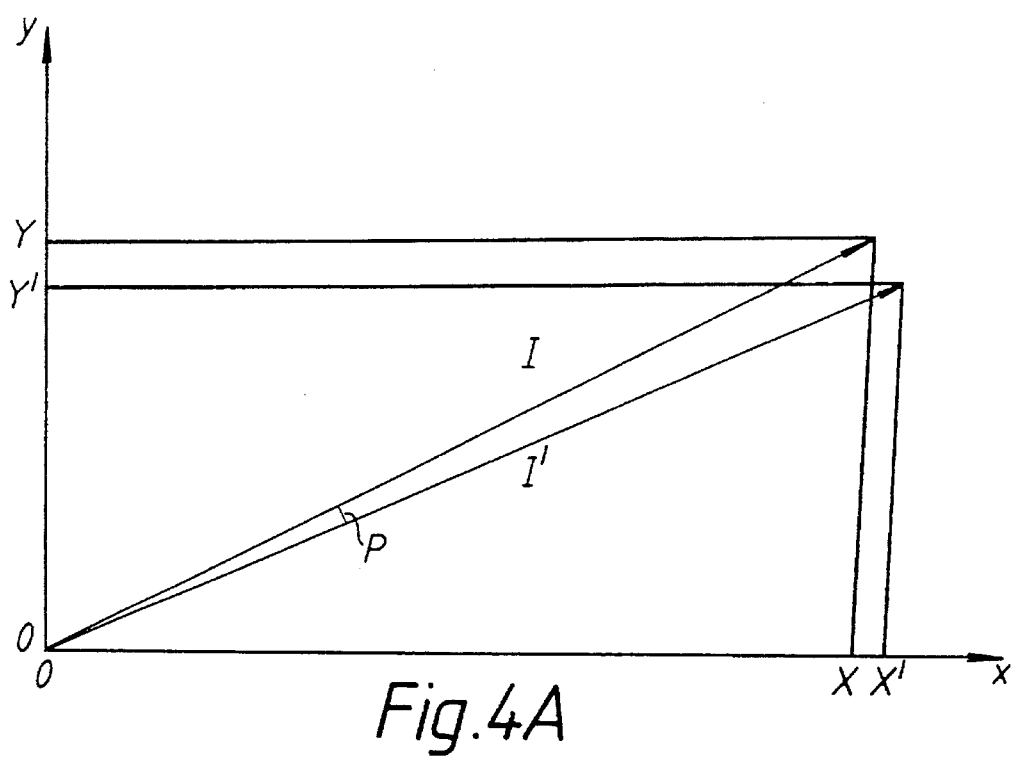
FIG. 4a illustrates compensation of phase error.
Figure 4B:
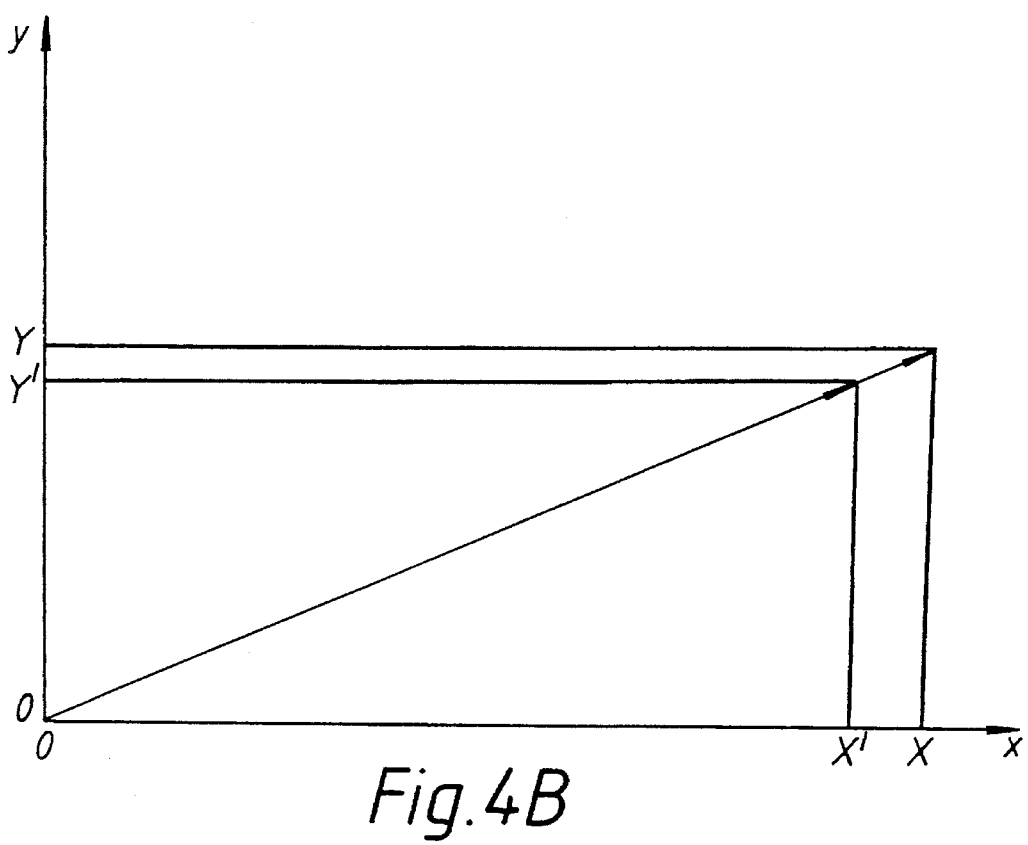
FIG. 4b illustrates compensation of ratio error.

As mentioned above, microprocessor 8 of the meter shown in FIG. 3 uses an internal representation of the measured current as a two-component vector. The measured current is represented in FIG. 4a by the vector I' having components (X', Y'). In order to compensate for phase error in the current transformer the microprocessor 8 calculates the phase error P using an appropriate form of equation 1 (i.e. an appropriate power, M) and the values of constants $K_1$ and $K_2$ held in the non-volatile memory 9, and "rotates" the measured current vector I' to produce a corrected current vector I having components (X, Y), as follows:

$$X=X' \cdot \cos(P) - Y' \cdot \sin(P) \quad (4a)$$

$$Y=X' \cdot \sin(P) - Y' \cdot \cos(P) \quad (4b)$$

In practice, since P is small (typically less than 1°) cos (P) approximates to 1, and sin (P) approximates to P so the microprocessor 8 may use simplified equations, as follows:

$$X=X'-Y' \cdot P \quad (5a)$$

$$Y=Y'-X' \cdot P \quad (5b)$$

The microprocessor 6 compensates for ratio error by increasing the magnitude of the measured current vector I' (via calculating the ratio error, $r_e$ using the values of the constants $K_3$ and $K_4$ held in non-volatile memory 9 according to equation 2) as follows:

$$X=(1+r_e/100) X' \quad (6a)$$

$$Y=(1+r_e/100) Y' \quad (6b)$$

The corrected current vector is used by microprocessor 8 in the calculation of the metered quantities.

If it is desired to measure the total harmonic energy then the component of the corrected current vector in phase with the voltage is compared with the uncorrected component and the ratio is used as a correction to the total energy (i.e. it is used as a ratio of "measured energy" i.e. energy calculated based on the sensed values of voltage and current, to total energy).

For some metering applications a sufficient increase in metering accuracy may be obtained by compensating only for phase error in the current transformer.

Figure 5:
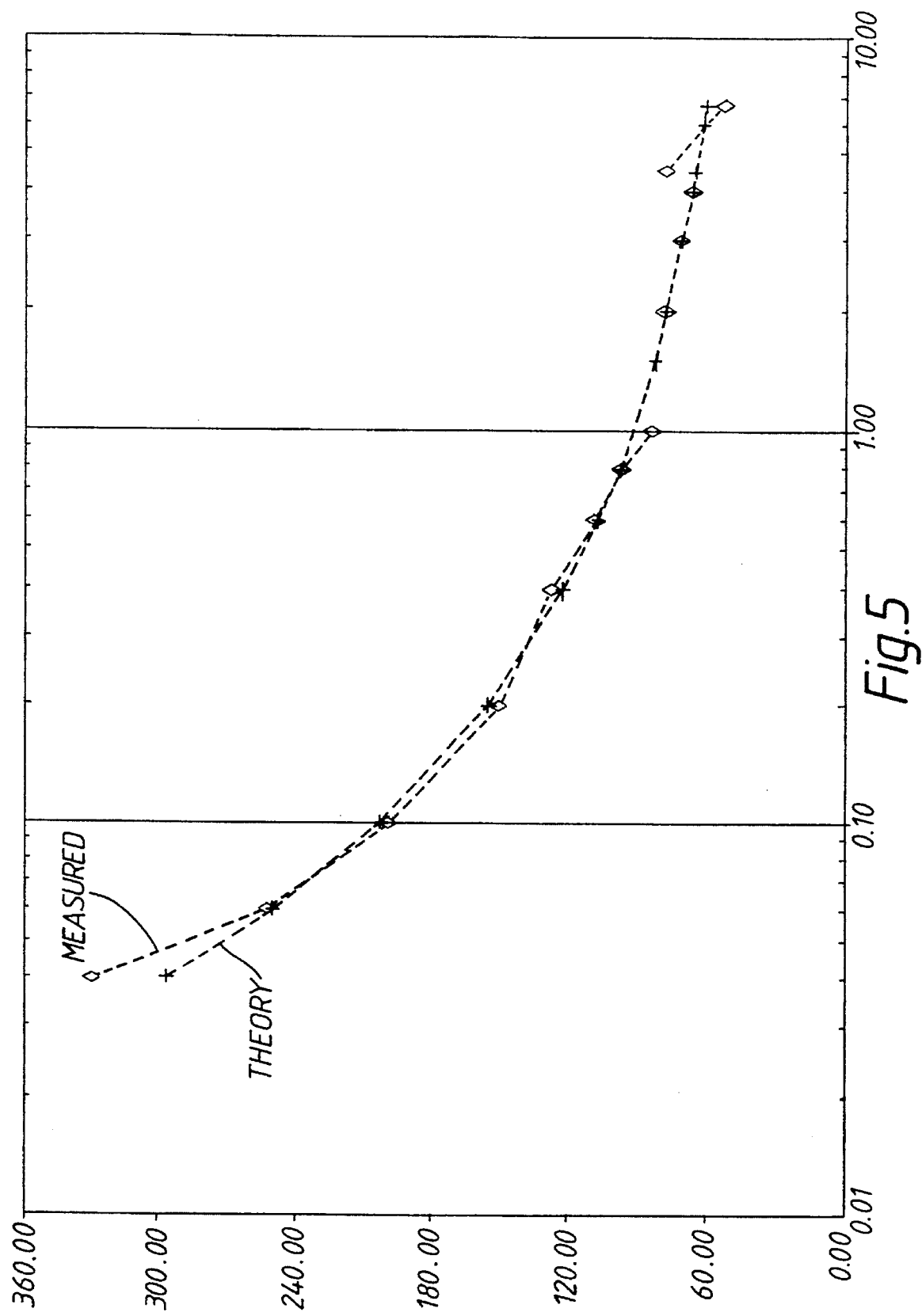
FIG. 5 compares measured and theoretical values of phase angle error, for a particular GOSS core, with theoretical values calculated according to equation (1) with M=½.

The detailed embodiment described above assumes that the variations in phase error and ratio error, with primary current magnitude, follow equations 1 and 2 exactly (with an appropriate choice of the power, M, in equation 1). In practice, although there is a good fit of measured values to theoretical values (as may be seen from FIG. 5 which compares measured values of phase error, obtained for a GOSS core, with theoretical values obtained using power M=½ in equation 1) even greater accuracy may be obtained by storing, in the correction apparatus, information on values of ratio error and/or phase error measured for that particular CT configuration at particular primary current reference points.

The correction circuitry would use the stored values of ratio error and/or phase error when correcting a measured secondary current vector corresponding to one of the reference points. For secondary currents which do not correspond to reference points, equations 1 and 2 would be used, along with stored values of the relevant constants, to produce values for phase and ratio errors by interpolation between, or extrapolation from, the values for the reference points.

In an alternative embodiment of the invention, the correction circuitry could work entirely on stored values of phase and ratio error (at primary current reference points spaced very close together).

We claim:

1. An electronic electricity meter comprising:

means for determining electrical energy consumed by a load including a current transformer sensing load current, the transformer comprising a core having a primary winding having $N_1$ turns carrying actual load current I and a secondary winding having $N_2$ turns carrying a secondary current $I_2$;

means connected to said transformer secondary winding for developing an estimated load current value $I_1$ from the measured secondary current according to the equation $$I_1=N_2/N_1 \times I_2,$$

the estimated value $I_1$ differing from load current I due to transformer phase error and ratio error, each such error varying as primary current I varies;

means for storing information representing transformer phase error or ratio error; and means operatively associated with said developing means and said storing means for calculating a corrected estimated load current value using the stored information for at least one of said phase error or ratio error and the estimated value $I_1$.

2. The electronic electricity meter of claim 1 wherein said calculating means calculates a value of phase error P for correcting estimated load current using the equation $$P=K_1+K_2 \times I_2^{-M}$$

where $K_1$, $K_2$ and M are constant values determined for the current transformer and stored by said storing means.

3. The electronic electricity meter of claim 1 wherein said calculating means calculates a value of ratio error RE for correcting estimated load current using the equation $$RE=K_3+K_4 \times \log I_2$$

where $K_3$ and $K_4$ are constant values determined for the current transformer and stored by said storing means.

4. The electronic electricity meter of claim 3 wherein said calculating means calculates a value of phase error P for correcting estimated load current using the equation $$P=K_1+K_2 \times I_2^{-M}$$

where $K_1$, $K_2$, and M are constant values determined for the current transformer and stored by said storing means.

5. The electronic electricity meter of claim 1 wherein said current transformer is internal to the meter.

6. The electronic electricity meter of claim 1 wherein said current transformer is external to the meter.

7. An electronic electricity meter comprising:

means for determining electrical energy consumed by a load including a current transformer sensing load current, the transformer comprising a core having a primary winding having $N_1$ turns carrying actual load current I and a secondary winding having $N_2$ turns carrying a secondary current $I_2$;

means connected to said transformer secondary winding for developing an estimated load current value $I_1$ from the measured secondary current according to the equation $$I_1 = N_2/N_1 \times I_2,$$

the estimated value $I_1$ differing from load current I due to transformer phase error which varies as primary current I varies;

means for storing data representing relationship between phase error and load current I; and means operatively associated with said developing means and said storing means for calculating a corrected estimated load current value using the stored information for said phase error and the estimated load current value $I_1$.

8. The electronic electricity meter of claim 7 wherein said calculating means calculates a value of phase error P for correcting estimated load current using the equation $$P = K_1 + K_2 \times I_2^{-M}$$

where $K_1$, $K_2$ and M are constant values determined for the current transformer and stored by said storing means.

9. The electronic electricity meter of claim 7 wherein the data stored in said storing means comprises a plurality of pairs of values, each pair comprising a primary current value and an associated predetermined phase error value and wherein said calculating means is adapted to select a value of phase error for use in correcting estimated load current that forms a pair with the estimated load current value.

10. The electronic electricity meter of claim 7 wherein the estimated value $I_1$ also differs from load current I due to transformer ratio error which varies as primary current I varies and wherein said calculating means calculates a value of ratio error RE for correcting estimated load current using the equation $$RE = K_3 + K_4 \times \log I_2$$

where $K_3$ and $K_4$ are constant values determined for the current transformer and stored by said storing means.

11. The electronic electricity meter of claim 10 wherein said calculating means calculates a value of phase error P for correcting estimated load current using the equation $$P = K_1 + K_2 \times I_2^{-M}$$

where $K_1$, $K_2$ and M are constant values determined for the current transformer and stored by said storing means.

12. The electronic electricity meter of claim 7 wherein said current transformer is internal to the meter.

13. The electronic electricity meter of claim 7 wherein said current transformer is external to the meter.

* * * * *